Figure 1:
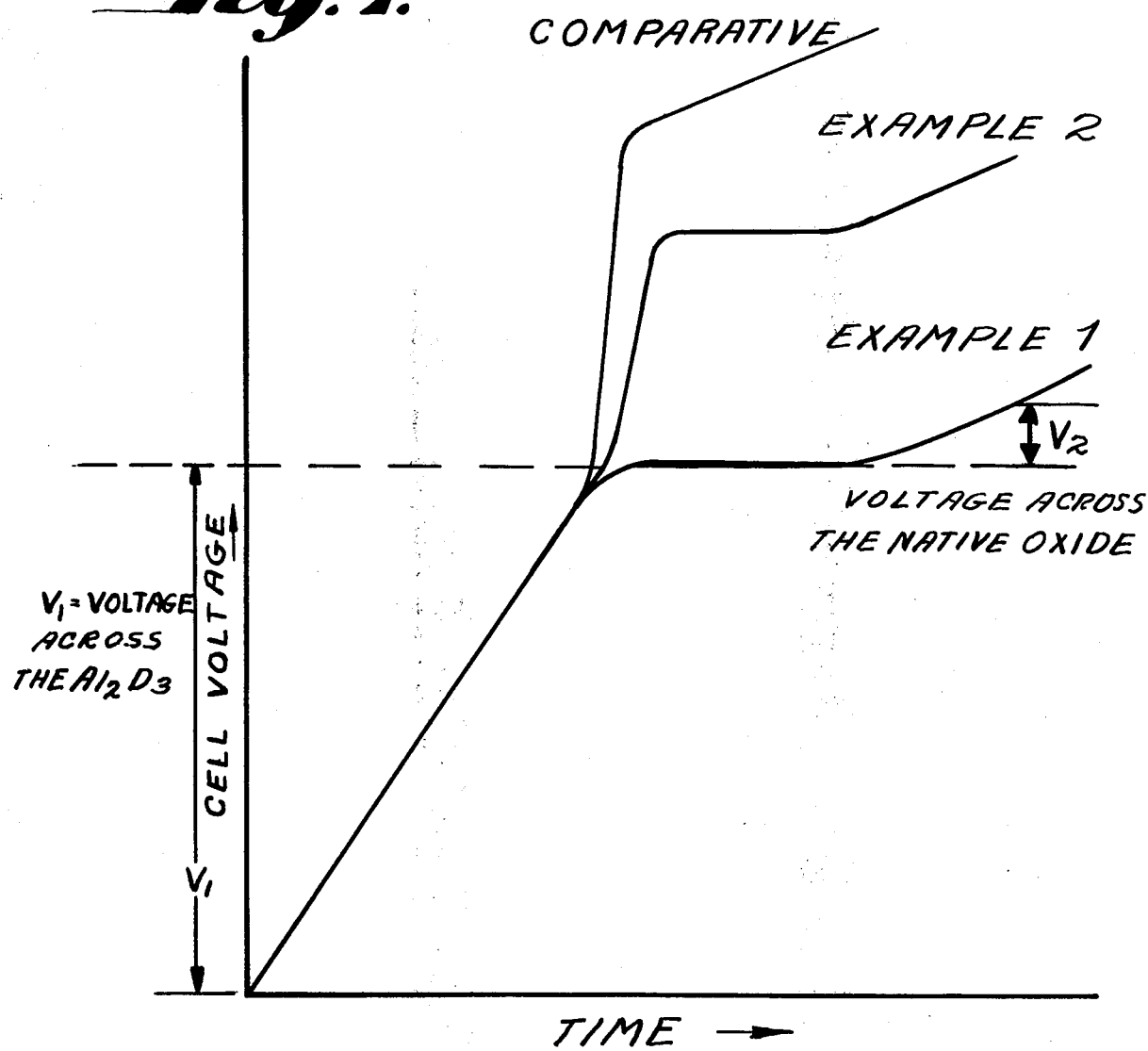

United States Patent [19]

Hartnagel et al.

[11] 4,133,724
[45] Jan. 9, 1979

[54] ANODIZING A COMPOUND SEMICONDUCTOR

[75] Inventors: Hans L. Hartnagel; Stephen J. Hannah; Burhan Bayraktaroglu, all of Newcastle-upon-Tyne, England

[73] Assignee: National Research Development Corporation, London, England

[21] Appl. No.: 856,094

[22] Filed: Nov. 30, 1977

[30] Foreign Application Priority Data

Dec. 7, 1976 [GB] United Kingdom ............ 51016/76

[51] Int. Cl.² .................... C25D 11/04; C25D 11/32; C25D 11/34
[52] U.S. Cl. .................................. 204/38 A; 204/42; 204/56 R; 204/58
[58] Field of Search .................. 204/35 N, 38 A, 42, 204/56 R, 58

[56] References Cited

U.S. PATENT DOCUMENTS

| 3,264,201 | 8/1966 | Schink et al. ............ 204/56 R |
| 3,351,825 | 11/1967 | Vidas ...................... 204/35 N |
| 3,882,000 | 5/1975 | Schwartz et al. ............ 204/38 A |

Primary Examiner—John H. Mack
Assistant Examiner—William Leader
Attorney, Agent, or Firm—Cushman, Darby & Cushman

[57] ABSTRACT

A method of anodizing a compound semiconductor comprises
(1) plating a metal on the compound semiconductor,
(2) contacting the exposed surface of the metal with an electrolyte which permits anodic oxidation of the metal, and
(3) passing an electric current through the electrolyte with the exposed surface of the metal acting as an anode, the current density not exceeding 100 microamps per square centimeter of the surface and the quantity of current being more than sufficient to oxidize anodically all the metal.

12 Claims, 2 Drawing Figures

ANODIZING A COMPOUND SEMICONDUCTOR

This invention relates to a method of anodising a compound semiconductor, and to the product of the method. The product may for example be a metal insulator semiconductor (MIS) device, a metal oxide semiconductor (MOS), a metal aluminium oxide semiconductor (MAOS) (e.g. a charge storage device) or a light guide.

According to a first aspect of the present invention, a method of anodising a compound semiconductor comprises (1) plating (e.g. vapour depositing) a metal on the compound semiconductor, (2) contacting the exposed surface of the metal with an electrolyte which permits anodic oxidation of the metal (preferably while protecting the compound semiconductor from the electrolyte), and (3) passing an electric current through the electrolyte with the exposed surface of the metal acting as an anode, the current density not exceeding 20 microamps (preferably not exceeding 10 microamps) per square centimeter of the surface and the quantity of current being more than sufficient to oxidise anodically all the metal.

According to a second aspect of the present invention, a method of anodising a compound semiconductor comprises (1) plating (e.g. vapour depositing) a metal on the compound semiconductor, (2) contacting the exposed surface of the metal with an electrolyte which permits anodic oxidation of the metal (preferably while protecting the compound semiconductor from the electrolyte), and (3) passing an electric current through the electrolyte with the exposed surface of the metal acting as an anode, the current density exceeding 20, but not exceeding 100, microamps per square centimeter of the surface and the quantity of current being more than sufficient to oxidise anodically all the metal.

Preferably the compound semiconductor is a compound between a Group III and a Group V element, for example gallium arsenide. Preferably the compound semiconductor is a single crystal, and before the plating it may be cleaned as necessary and etched.

Preferably the metal is a valve metal, that is, one of tantalum, hafnium, zirconium, titanium, zinc, nickel or aluminium, and preferably the metal is plated to a thickness of at least 50Å, this being in practice about the thinnest which will give a reasonably even coating. The oxide resulting after all the metal has been anodically oxidised will have a thickness, depending on the conditions of formation, of at least approximately 75Å. The metals named above are all anodisable and yield oxides having a high dielectric constant.

Preferably the electrolyte comprises water and a dissolution-of-metal inhibitor such as a polyhydric alcohol, e.g. glycerol or a diol such as a glycol for example ethylene glycol or propylene glycol. The electrolyte advantageously further comprises a base, a salt or an acid such as phosphoric acid or an organic acid e.g. tartaric acid, citric acid or a carboxylic acid such as acetic acid.

The base, salt or acid may be buffered and preferably would have a pH of from 2 to 9 if dissolved in the water before the polyhydric alcohol is added. (It is quite in order to dissolve the required quantity of base, salt or acid in the polyhydric alcohol and then to add the water.)

The acid may be present in a weight concentration relative to the water of 0.1 to 10%, preferably 1 to 5%.

The volume ratio of the polyhydric alcohol to the water is preferably at least 1.0, more preferably at least 1.1, and may be up to 100, preferably up to 10, more preferably up to 5. With insufficient polyhydric alcohol, the utility of the electrolyte is rendered excessively pH-dependent, and the electrolyte may tend to dissolve the anode. With insufficient water, the electrolyte becomes inefficient at promoting anodic film formation.

The quantity of current is preferably such as to give at least 30Å thickness of native semiconductor oxide underlying the anodically oxidised metal, the thickness of the native oxide being chosen to be appropriate for the required use. For a charge storage device, the last-mentioned thickness has to be small enough to permit tunnelling under gate stress but large enough to prevent back-tunnelling, and as a guide a thickness less than 200Å, preferably 30Å–50Å, may be suitable for this purpose.

Figure 2:

In The Drawings:

FIG. 1 is a graph of overpotential/time curves for Examples 1, 2 and a comparative case; and FIG. 2 is a cross sectional view of the layered anodized semiconductor of the invention.

The invention will now be described by way of example.

EXAMPLE 1

A single crystal of gallium arsenide was polished, cleaned and etched. Then aluminium was plated onto it to a thickness of 500Å. This thickness was calculated to give a thickness of $Al_2O_3$, following anodic oxidation, of 750 – 800Å.

The assembly was coated with wax to protect all but the aluminium surface and to adhere the assembly to a support which conveyed a current-carrying wire to the gallium arsenide at a point distant from the aluminium. The wire made ohmic connection with the gallium arsenide through an ohmic contact film of silver, 2000Å thick, deposited on the gallium arsenide by way of a layer of indium 200Å thick. The assembly was then immersed in an electrolyte consisting of tartaric acid and glycol. The electrolyte had been prepared by producing a 3% aqueous solution of tartaric acid and buffering this solution with ammonia to a pH of 6.2. Then 2 volumes of propylene glycol were added to 1 volume of the aqueous buffered tartaric acid. The mixture was stirred while heating to 50° C. to dissolve any precipitate and was then allowed to cool.

The assembly was treated as the anode, and, using Pt as a cathode, a current density of 10 microamp per square centimeter of the aluminium was caused to flow. Whether the gallium arsenide was left in the dark or in the light did not seem to make any difference if the GaAs was p-type. Where it was n-type, it was slightly preferable to perform this operation in the light. The aluminium thus slowly anodically oxidised to $Al_2O_3$, and neither the aluminium not its oxide dissolved in the electrolyte.

At length, all the aluminium was anodically oxidised to $Al_2O_3$, which was about 800Å thick. Electrolysis was however continued, and at that current density had the effect of transporting $OH^-$ ions from the electrolyte through the $Al_2O_3$ and through any gallium arsenide oxide which had formed to the underlying gallium arsenide, with negligibly few Ga or As ions passing in the opposite direction. Thus, even when the gallium arsenide native oxide had reached a discernible thickness, the native oxide grew at the gallium-arsenide/galliumarsenide-oxide interface and not at the gallium-arsenide-oxide/aluminium-oxide interface. Thus native oxide growth of the gallium arsenide took place in situ underneath the $Al_2O_3$ overlayer, with the latter preventing such species as $As_2O_3$ dissolving into the electrolyte or from even moving away. Thus they acted as a protective barrier to the underlying gallium arsenide oxide, both to stop the latter from dissolving (which it would do in that electrolyte faster than it would anodically oxidise at that current density) and to prevent impurities in the electrolyte from contaminating it.

Electrolysis was continued until the gallium arsenide was oxidised to a depth of 50Å. Then, the resulting structure was washed and annealed at 350° C. in an inert (nitrogen) atmosphere for 15 minutes, whereafter aluminium contact pads were evaporated on to the aluminium oxide. The structure could then be cut into separate components if desired, with one pad per component and all of the components had very similar electrical properties. Each component could in fact be considered as a metal, aluminium oxide, native oxide, semiconductor (MAOS) diode, and these have been found satisfactory as charge storage devices.

As shown in FIG. 2 the final structure comprised a gallium arsenide layer 2 having a layer of gallium arsenide natural oxide 4 thereon and an overlayer 6 of aluminium oxide.

EXAMPLE 2

The procedures of Example 1 were repeated except that the current density of the electrolysis was 35 microamps per square centimeter of the aluminium. At this current density, a proportion of the current was carried by Ga and As ions, which combined with $OH^-$ ions to form native gallium arsenide oxide at the gallium arsenide oxide/aluminium oxide interface, in other words the gallium arsenide oxide grew at that interface. The resulting structure could be used as a charge storage device. At that current density, the Ga and As cations, although mobile through gallium arsenide oxide, could not travel through the aluminium oxide.

EXAMPLE 3

The procedures of Example 1 were repeated except that the electrolysis was continued until the gallium arsenide was oxidised to a depth of approximately 400Å. The resulting structure could be used as a metal insulator semiconductor (MIS) device, since for practical purposes charge storage is not shown by this structure.

Overpotential/time curves were plotted for Example 1, Example 2 and for a comparative case (not according to the invention) where the current density of the electrolysis was several milliamps per square centimeter. These curves are shown in FIG. 1. The overpotential is the voltage difference between anode and cathode, and this initially rose linearly with time in all three cases. As an instance, which can be identified as the completion of oxidation of the aluminium, the three curves exhibited different characteristic behaviour compared with their $Al_2O_3$ growth stages. Example 1 flattened out (e.g. rising only 2 volts in 3 hours), whereafter it picked up again at a constant gradient. Example 2, after the complete formation of $Al_2O_3$, rose rather steeply compared with the $Al_2O_3$ growth stage, then flattened out, then picked up to a constant gradient. The comparative case, after the complete formation of $Al_2O_3$, rose very steeply, then rose directly at a constant gradient.

From the point of complete formation of $Al_2O_3$ onwards (in time), only the gallium arsenide was being oxidised; hence the overpotential difference (in volts) between that point and any subsequent instant is the voltage across the gallium arsenide native oxide, the thickness of which at that instance can thus be readily deduced.

The use of an overpotential/time curve thus permits a check on whether growth is according to Example 1, Example 2 or the comparative case, and on the thickness which the gallium arsenide native oxide has reached.

Using this technique (or otherwise), and thanks to the Schottky effect ensuring that the aluminium is oxidised before the gallium arsenide, it would be possible to discontinue electrolysis at the instant when all the aluminium is oxidised. The resulting product might find application as a misfet (MIS field effect transistor) showing, it is hoped, no memory characteristics.

A charge storage device made as described above could find application, having regard to the high-speed capabilities of gallium arsenide, as a fast-access long term MAOS memory requiring no external power source to hold the memory.

It was found in the comparative case discussed above (with high current density electrolysis) that the gallium arsenide oxide was formed at the aluminium oxide/electrolyte interface, showing that Ga and As cations migrated through the $Al_2O_3$ layer and that a negligible proportion of the current was carried by $OH^-$ anions. Thus, by controlling the current density of electrolysis, the position of the gallium arsenide (or other compound semiconductor) oxide can be controlled at will with respect to the aluminium (or other metal) oxide. By such control, a planar structure could be made with a high refractive index material plated over a low refractive index material, giving a low-loss light channel.

By such control it would also be possible to form a high-resistance layer (e.g. of aluminium oxide) over a native oxide itself over (in this case) aluminium; there would be good bonding including a buffer to take up differential thermal expansion. This structure would have good corrosion resistance and could be used to protect printed (copper) circuit boards. A possible mode of fabrication would be to plate aluminium over the printed circuit and to oxidise the aluminium and part of the underlying copper. The aluminium oxide would have superior anticorrosion properties to lacquer.

We claim:

1. A method of anodising a compound semiconductor, comprising
   (1) plating a metal on the compound semiconductor,
   (2) contacting the exposed surface of the metal with an electrolyte which permits anodic oxidation of the metal, and
   (3) passing an electric current through the electrolyte with the exposed surface of the metal acting as an anode, the current density not exceeding 100 microamps per square centimeter of the surface and the quantity of current being more than sufficient to oxidise anodically all the metal.

2. A method according to claim 1, in which the current density does not exceed 10 microamps per square centimeter.

3. A method according to claim 1, wherein, during step (2), the compound semiconductor is protected from the electrolyte.

4. A method according to claim 1, wherein the plating of step (1) is performed by vapor deposition.

5. A method according to claim 1, wherein the quantity of current is such as to give at least 30Å thickness of native semiconductor oxide underlying the anodically oxidised metal.

6. A method according to claim 1, wherein the compound semiconductor is a compound between a Group III and a Group V element.

7. A method according to claim 6, wherein the compound semiconductor is gallium arsenide.

8. A method according to claim 6, wherein the compound semiconductor is a single crystal.

9. A method according to claim 6, wherein the metal is one of tantalum, hafnium, zirconium, titanium, zinc, nickel and aluminium.

10. A method according to claim 9, wherein the metal is plated to a thickness of at least 50Å.

11. A method of anodising a compound semicondctor, comprising
 (1) plating a metal on the compound semiconductor,
 (2) contacting the exposed surface of the metal with an electrolyte which permits anodic oxidation of the metal, and
 (3) passing an electric current through the electrolyte with the exposed surface of the metal acting as an anode, the current density exceeding 20 but not exceeding 100 microamps per square centimeter of the surface and the quantity of current being more than sufficient to oxidise anodically all the metal.

12. A method of anodising a compound semiconductor, comprising
 (1) plating a metal on the compound semiconductor,
 (2) contacting the exposed surface of the metal with an electrolyte which permits anodic oxidation of the metal, and
 (3) passing an electric current through the electrolyte with the exposed surface of the metal acting as an anode, the current density not exceeding 20 microamps per square centimeter of the surface and the quantity of current being more than sufficient to oxidise anodically all the metal.

* * * * *